United States Patent
Morand

(10) Patent No.: US 7,939,887 B2
(45) Date of Patent: *May 10, 2011

(54) ACTIVE SEMICONDUCTOR COMPONENT WITH A REDUCED SURFACE AREA

(75) Inventor: Jean-Luc Morand, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/632,641

(22) Filed: Dec. 7, 2009

(65) Prior Publication Data

US 2010/0078673 A1 Apr. 1, 2010

Related U.S. Application Data

(63) Continuation of application No. 11/477,260, filed on Jun. 29, 2006, now Pat. No. 7,649,212, which is a continuation of application No. 10/763,070, filed on Jan. 22, 2004, now abandoned.

(30) Foreign Application Priority Data

Dec. 5, 2003 (FR) ...................................... 03 50985

(51) Int. Cl.
*H01L 29/32* (2006.01)
*H01L 29/74* (2006.01)

(52) U.S. Cl. ........ 257/335; 257/288; 257/301; 257/304; 257/329; 257/330; 257/341; 257/343; 257/E29.027; 257/E29.113; 257/E29.211; 257/E29.337

(58) Field of Classification Search ................... 257/288, 257/301, 304, 329, 330, 335, 341, 343, E29.027, 257/E29.113, E29.211, E29.337

See application file for complete search history.

(56) References Cited

U.S. PATENT DOCUMENTS

| 3,069,603 | A |  | 12/1962 | Hunter |
| 3,128,530 | A |  | 4/1964 | Rouse et al. |
| 3,254,275 | A |  | 5/1966 | Lob |
| 3,411,054 | A |  | 11/1968 | Cullis |
| 3,925,803 | A |  | 12/1975 | Kobayashi |
| 3,979,820 | A |  | 9/1976 | Anthony et al. |
| 3,988,764 | A |  | 10/1976 | Cline et al. |
| 3,988,771 | A |  | 10/1976 | Krishna |
| 4,032,955 | A |  | 6/1977 | Anthony et al. |
| 4,032,960 | A |  | 6/1977 | Anthony et al. |
| 4,720,734 | A | * | 1/1988 | Amemiya et al. ............ 257/484 |

(Continued)

FOREIGN PATENT DOCUMENTS

EP 0 271 346 6/1988

(Continued)

OTHER PUBLICATIONS

French Search Report from corresponding French National Application No. 03/50985 filed Dec. 5, 2003.

(Continued)

*Primary Examiner* — Dao H Nguyen
(74) *Attorney, Agent, or Firm* — Lisa K. Jorgenson; James H. Morris; Wolf, Greenfield & Sacks, P.C.

(57) ABSTRACT

A semiconductor component in which the active junctions extend perpendicularly to the surface of a semiconductor chip substantially across the entire thickness thereof. The contacts with the regions to be connected are provided by conductive fingers substantially crossing the entire region with which a contact is desired to be established.

38 Claims, 7 Drawing Sheets

U.S. PATENT DOCUMENTS

| | | | |
|---|---|---|---|
| 4,724,223 | A | 2/1988 | Ditchek |
| 4,829,173 | A | 5/1989 | Ditchek et al. |
| 4,984,037 | A | 1/1991 | Ditchek et al. |
| 5,680,073 | A * | 10/1997 | Nathan et al. ............ 327/586 |
| 6,084,277 | A | 7/2000 | Disney et al. |
| 6,201,279 | B1 | 3/2001 | Pfirsch |
| 6,229,194 | B1 | 5/2001 | Lizotte |
| 6,410,958 | B1 | 6/2002 | Usui et al. |
| 6,462,359 | B1 | 10/2002 | Nemati et al. |
| 6,525,375 | B1 | 2/2003 | Yamaguchi et al. |
| 6,624,472 | B2 | 9/2003 | Hurkx et al. |
| 6,781,198 | B2 | 8/2004 | Disney |
| 7,053,404 | B2 * | 5/2006 | Morand ............ 257/46 |
| 7,649,212 | B2 * | 1/2010 | Morand ............ 257/107 |
| 2002/0040994 | A1 | 4/2002 | Nitta et al. |
| 2002/0063281 | A1 | 5/2002 | Tihanyl |
| 2003/0141514 | A1 | 7/2003 | Yamaguchi et al. |
| 2004/0043565 | A1 | 3/2004 | Yamaguchi et al. |

FOREIGN PATENT DOCUMENTS

| | | |
|---|---|---|
| EP | 1 094 525 A2 | 4/2001 |
| JP | 06151863 A | 5/1994 |
| WO | 00/35018 | 6/2002 |

OTHER PUBLICATIONS

French Search Report from related French National Application No. 03/50987 filed Dec. 5, 2003.

French Search Report from related French National Application No. 03/50989 filed Dec. 5, 2003.

Zhong J.X. et al., Electronic Structure of a Fractal Model of Porous Silicon, J. Non-Cryst. Solids (Netherlands), Dec. 1993, vol. 164-166, Pt. 2, pp. 969-972, XP002290027.

* cited by examiner

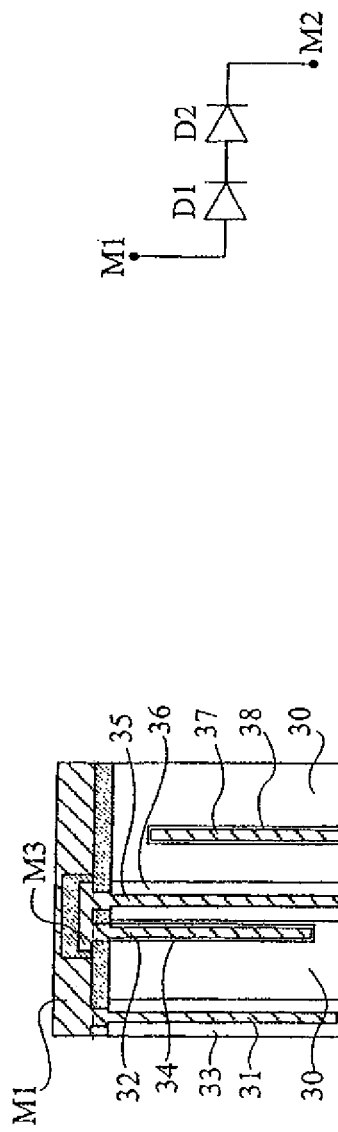
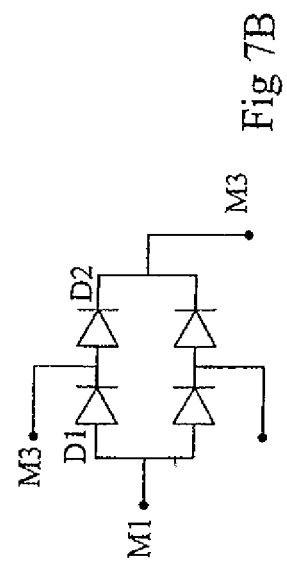
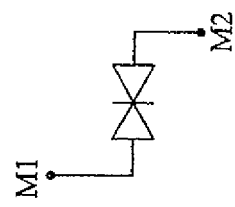
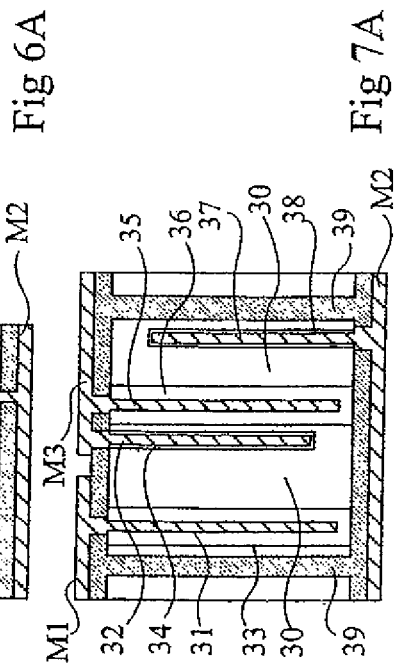
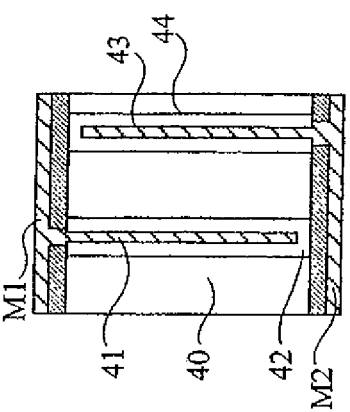

ACTIVE SEMICONDUCTOR COMPONENT WITH A REDUCED SURFACE AREA

CROSS REFERENCE TO RELATED APPLICATION

This application is a continuation of prior application Ser. No. 11/477,260, filed Jun. 29, 2006, entitled "Active Semiconductor Component With A Reduced Surface Area", which is a continuation of application Ser. No. 10/763,070, filed Jan. 22, 2004, entitled "Active Semiconductor Component With A Reduced Surface Area", which claims the priority benefit of French patent application number 03/50985, filed on Dec. 5, 2003, entitled "Active Semiconductor Component With A Reduced Surface Area," each of which is hereby incorporated by reference to the maximum extent allowable by law.

BACKGROUND OF THE INVENTION

1. Field of the Invention

The present invention relates to a novel type of semiconductor component. The present invention more specifically applies to power components and to protection components intended to handle high voltages, such components being generally called discrete components, although several such components may be provided on the same chip, and/or they may be associated with logic circuits provided on the same chip.

2. Discussion of the Related Art

FIGS. 1A and 1B show as an example a perspective view and a cross-section view of a conventional vertical power diode. This diode is formed from a substrate comprising a heavily-doped N-type region 1 ($N^+$) and a lightly-doped N-type region 2 coated with a P-type layer 3. The upper surface is coated with an anode metallization 4 and the lower surface is coated with a cathode metallization 5. Reference numeral 6 designates an insulating layer.

FIG. 2 is a perspective view of a vertical power thyristor. The thyristor comprises a lightly-doped N-type substrate 10. On the upper surface side is formed a P-type well 11 containing an N-type cathode region 12. On the lower surface side is formed a P-type anode layer 13. An anode metallization MA, a cathode metallization MK, and a gate metallization MG are also provided. To prevent for the anode metallization from short-circuiting to substrate 10, or to separate this thyristor from a neighboring component, a peripheral P-type insulating wall 15 is generally provided.

It should incidentally be noted that in the present description, the term "diode" designates a PN or Schottky diode intended to be used as a power, protection, or avalanche diode. A diode is a bipolar component having two terminals intended to be connected to elements of a dielectric or electronic circuit, discrete or integrated, that, according to cases, conducts a forward current and blocks a reverse current (rectifying diode), or conversely, conducts a reverse current when the voltage thereacross exceeds a given threshold (protection diode). In the thyristor of FIG. 2, the separation surface between P-type insulating wall 15 and N-type substrate 1 is never intended to be conductive, but only either to enable the component periphery to be entirely at the rear surface potential, or to insulate well 1 from an adjacent well containing another component. This separation surface is not associated with terminals intended to be connected to elements of an electric or electronic circuit. Such a separation surface does not form a diode (sometimes conductive, sometimes blocked) connected to terminals of connection to a circuit.

A disadvantage of vertical components is their on-state resistance. Indeed, the thicknesses of the various layers and regions are optimized according to the desired diode characteristics. In particular, the thickness of N-type layer 2 (diode) or 10 (thyristor) must be sufficiently high for the component to have a desired breakdown voltage but must also be as small as possible to limit the on-state resistance of the component. In the case of a diode, $N^+$ layer 1 has no active function in the diode operation. It is only used to ensure an ohmic contact with the metallization and is used to reduce the diode's on-state resistance linked to the fact that a silicon wafer has, in current technologies, a thickness of from 300 to 500 µm, in most cases much greater than the desired thickness of N layer 2 (for example, 60 µm to hold 600 V). In the case of the thyristor, the thickness of layer 10 is also required by the thickness of the silicon wafer and various means, often complex, are used to reduce it.

Another disadvantage of vertical components is that the surface area of the active junctions is linked to the semiconductor chip surface area taken up by the components, the junctions being horizontal (in planes parallel to the main diode surfaces).

Further, such components intended to handle high voltages pose many problems to ensure a proper breakdown voltage at the periphery of the semiconductor or Schottky junction, as well as to insulate the entire component and ensure its protection (insulating wall).

A $PNN^+$ diode and a thyristor have been described as an example only of vertical components, the problems indicated hereabove generally relating to vertical power or high-voltage components, for example, Schottky diodes, bi-directional components, or MOS-type voltage-controlled components.

SUMMARY OF THE INVENTION

The present invention aims at providing novel types of diodes, and more generally novel types of semiconductor power or high-voltage components enabling avoiding at least some of the above-mentioned disadvantages of vertical components, in particular increasing the active junction surface area with respect to the surface area of the chip in which the component is formed, reducing the on-state voltage drop, and simplifying the peripheral structure of the individual components.

To achieve these and other objects, the present invention provides a semiconductor component in which the active junctions extend perpendicularly to the surface of a semiconductor chip substantially across the entire thickness thereof.

According to an embodiment of the present invention, the contacts with the regions to be connected are provided by conductive fingers substantially crossing the entire region with which a contact is desired to be established.

According to an embodiment of the present invention, the conductive fingers are metal fingers.

According to an embodiment of the present invention, the semiconductor component is of multicellular type and the junctions are formed of several cylinders perpendicular to the main substrate surfaces.

According to an embodiment of the present invention, the component is a diode comprising an alternation of regions of a first conductivity type and of a second conductivity type extending across the entire substrate thickness, the regions of a first type being crossed by conductive fingers connected to a metallization extending over an entire surface of the substrate, and the regions of the second type being crossed by conductive fingers connected to a metallization on the other substrate surface.

According to an embodiment of the present invention, the diode is formed in an N-type semiconductor substrate, the conductive fingers penetrating into the N-type regions being surrounded with heavily-doped N-type regions.

According to an embodiment of the present invention, the component is a bipolar transistor alternately comprising a region of a first conductivity type, a region of a second conductivity type, and a region of the first conductivity type, each of these regions extending across the entire thickness of the substrate and being in contact with at least one conductive finger, each of these conductive fingers being respectively connected to an emitter metallization, to a base metallization, and to a collector metallization.

According to an embodiment of the present invention, the component is a thyristor successively comprising a first region of a first conductivity type, a second region of the second conductivity type, a third region of the first conductivity type, and a fourth region of the second conductivity type, each of these regions extending across the entire substrate thickness, a conductive finger extending into the entire first region, at least one conductive finger extending into the entire second region, and at least one conductive finger extending into the entire fourth region.

According to an embodiment of the present invention, in the thyristor, the first conductivity type is type N, the second conductivity type is type P, the first region being a cathode region and the fourth region an anode region, and localized metallizations extend vertically between the gate region and the cathode region to form localized gate-cathode short-circuits.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 6A and 6B respectively are a simplified cross-section view and a circuit diagram of a diode assembly according to the present invention;

FIGS. 7A and 7B respectively are a simplified cross-section view and a circuit diagram of another diode assembly according to the present invention;

FIGS. 8A and 8B respectively are a simplified cross-section view and a circuit diagram of another diode assembly according to the present invention;

DETAILED DESCRIPTION

As conventional in the field of semiconductor representation, the various drawings are not to scale. Especially, in these various drawings, the lateral dimensions have been greatly exaggerated with respect to the vertical directions. Indeed, a silicon wafer currently has a thickness of from 300 to 500 µm—and greater thicknesses may be chosen for an implementation of the present invention—while patterns and vias may be defined according to dimensions on the order of from 1 to 10 µm.

Figure 1A:
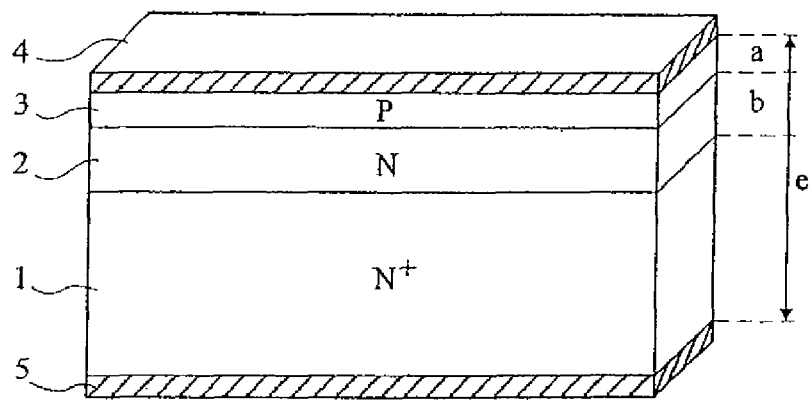
FIGS. 1A and 1B, previously described, are simplified perspective and cross-section views of a conventional vertical diode structure.
Figure 1B:
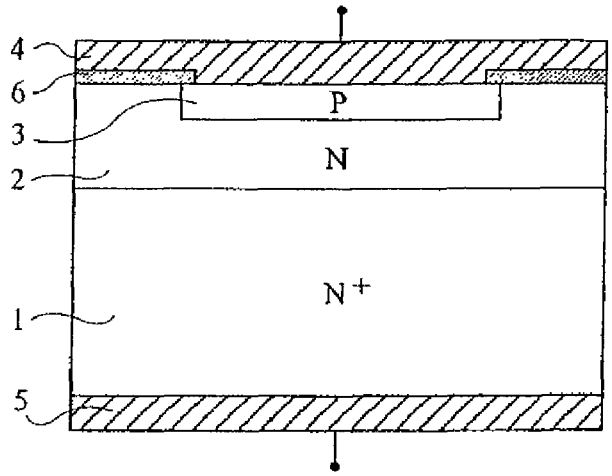
Figure 2:
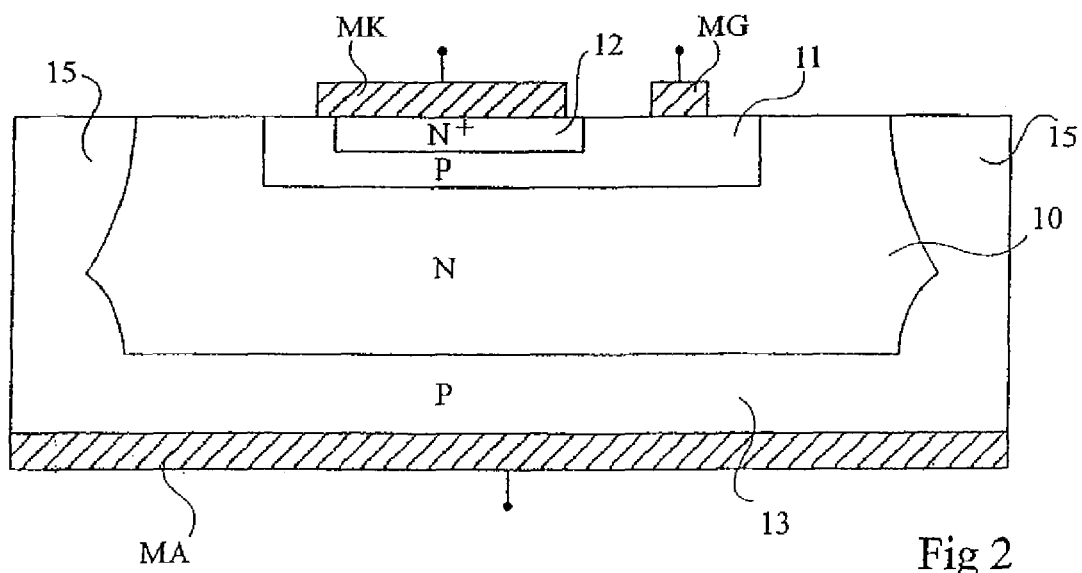
FIG. 2, previously described, is a simplified cross-section view of a conventional vertical thyristor structure.
Figure 3:
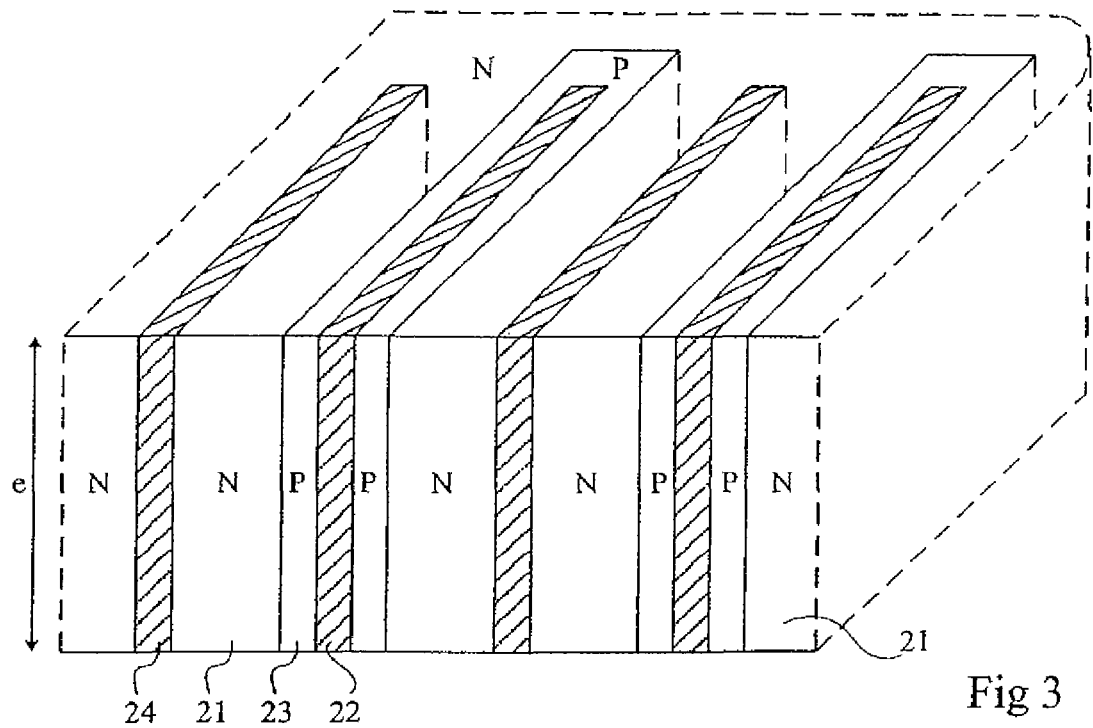
FIGS. 3 and 4 are simplified perspective views of two embodiments of a diode according to the present invention.

FIG. 3 is a simplified perspective view of a portion of a semiconductor component in which is formed an assembly of diode cells according to the present invention. The main surfaces of the component correspond to the upper and lower surfaces of a semiconductor wafer, and the vertical surface, having its thickness designated as e, corresponds to the thickness of the semiconductor wafer.

The junction of each diode cell is formed vertically across the thickness of the semiconductor wafer.

In FIG. 3, the structure is formed from a lightly-doped N-type silicon wafer 21. For each cell, a plate-shaped metallization 22 vertically formed in a trench extends along the entire height or most of the height of the semiconductor wafer. A P-type region 23 is adjacent to a portion of N-type wafer 21 and a plate-shaped metallization 24 extends vertically in a trench adjacent to said portion of N-type wafer 21. Thus, the diode junction is a vertical junction between N and P regions 21 and 23. It is only useful to provide between the N region and metallization 22 a very thin $N^+$-type layer (not shown) to ensure the ohmic contact without requiring, as in the case of conventional diodes, provision of a thick $N^+$ region. Thus, the on-state voltage drop in the diode is reduced.

Figure 4:
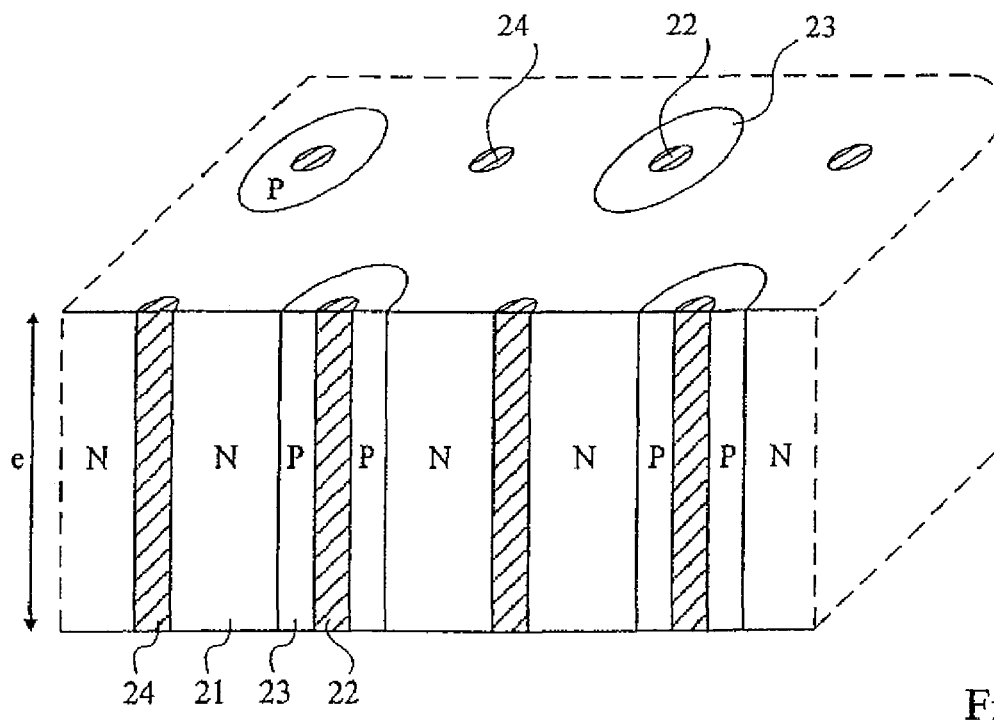

FIG. 4 shows a currently preferred alternative topology of a multicellular diode according to the present invention, it being understood that in certain cases, a single diode cell may be used. The structure is formed again in an N-type substrate 21, the thickness of which is designated as e. The metallizations, instead of corresponding to plates formed in parallel trenches, are formed of cylindrical fingers. A way to form such a structure is to form from a wafer surface first openings 22 preferably extending across the entire height e of the substrate. From these openings is formed a P-type diffusion 23, after which the openings are filled with metal to form vias 22. Second openings 24, in quincunx with respect to openings 22, also extend preferably across the entire substrate height. A short $N^+$ diffusion (not shown) is formed from the second openings which are filled with metal to form vias 24. All vias 22 are interconnected and all vias 24 are interconnected by anode and cathode metallizations, not shown, insulating layers, not shown, ensuring the necessary insulations. A diode with vertical junctions having a low on-state resistance and a density much greater than what could be obtained with a conventional diode with a horizontal junction is obtained between these metallizations, for example, respectively formed on the upper and lower structure surfaces. This type of structure further has the advantage of avoiding breakdown voltage problems at the diode periphery posed by conventional structures.

It should be noted that, instead of providing simple conductive fingers 24, metal could be present all around useful N-type areas 21. The structure can then be seen as a conductive (metal) plate comprising openings containing concentric cylindrical elements comprising a central via 22, surrounded with a P-type semiconductor cylinder 23, surrounded with an N-type semiconductor cylinder 21, possibly surrounded with an $N^+$ semiconductor cylinder.

The above description essentially aims at the diode structure and the order of the manufacturing steps may be modified.

In the following, term "via" or "finger" will be used to designated the plate-shaped elements of FIG. 3 as well as the finger-shaped elements of FIG. 4.

Figure 5A:
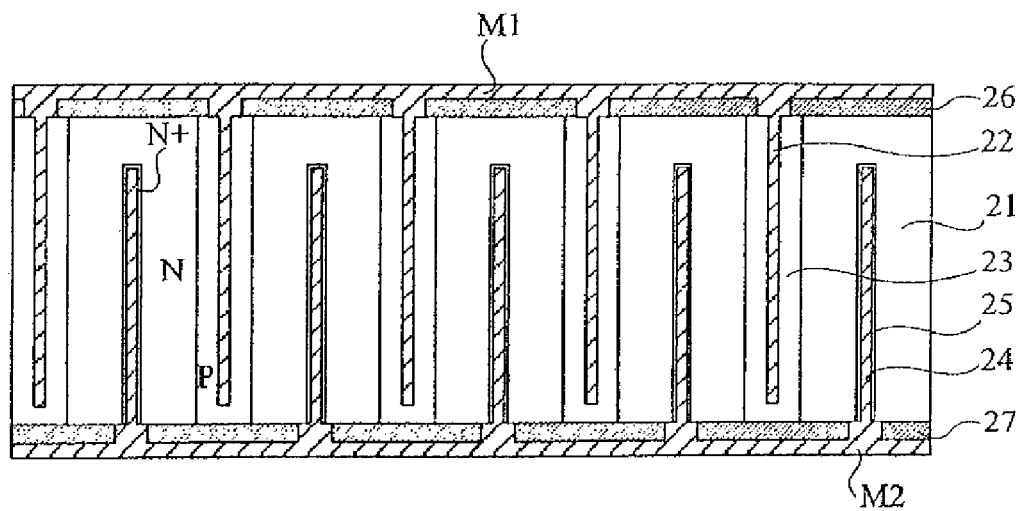
FIGS. 5A and 5B respectively are a simplified cross-section view and a circuit diagram of a diode according to the present invention.

FIG. 5A shows a more detailed cross-section view of a structure such as that in FIGS. 3 and 4. The same elements as in FIGS. 3 and 4 are designated with the same reference numerals. Reference numerals 26 and 27 designate insulating layers. Insulating layer 26 on the upper substrate surface covers all the N regions and insulating layer 27 on the lower substrate surface covers all the P regions. An upper surface metallization M1 is in contact with all vias 22 in contact with P-type regions 23 and a lower surface metallization M2 is in contact with all vias 24 in contact with N+-type regions 25, themselves in contact with portions of N substrate 21.

In the example of FIG. 5A, the upper layer vias have been shown as substantially through vias and the lower layer vias have been shown as non-through vias. However, other options may be chosen according to the selected manufacturing technologies.

Figure 5B:
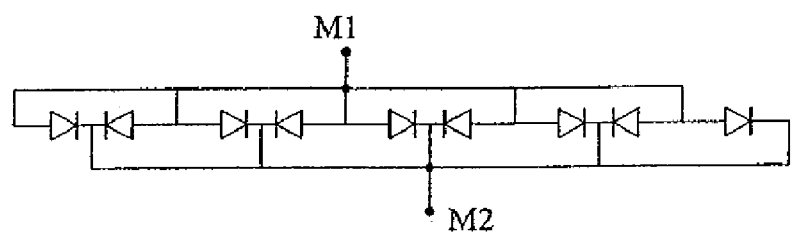

FIG. 5B shows the equivalent diagram of the structure of FIG. 5A between metallizations M1 and M2. According to an advantage of the present invention, the junction surface area of the assembly of diode cells in parallel may be much greater than the surface area of the chip containing these diode cells, and this, all the more as thicker semiconductor wafers than is usual may be used. Another advantage of this type of manufacturing is that it is possible to form several components according to the present invention on a same wafer, each of these components being easily surroundable, if useful, with an insulating wall formed in any known fashion.

FIGS. 6A and 6B show a simplified cross-section view and an equivalent diagram of two diodes or diode cells D1 and D2 in series (tandem assembly) formed in an N-type semiconductor substrate 30. In FIG. 6A, the left-hand diode comprises two almost through conductive fingers 31 and 32, both starting from the upper surface. Finger 31 is surrounded with a P region 33 and finger 32 is surrounded with an N+ region 34. The right-hand diode comprises a conductive finger 35 starting from the upper surface surrounded with a P region 36 and a conductive finger 37 starting from the lower surface surrounded with an N+ region 38. Insulating layers are formed so that an upper metallization M1 is in contact with finger 31, an insulated metallization M3 connects conductive fingers 32 and 35, and a lower surface metallization M2 is in contact with conductive finger 37.

As shown in partial cross-section view in FIG. 7A and in the form of a diagram in FIG. 7B, by assembling two pairs of diode such as diodes D1 and D2 of FIGS. 6A and 6B, and by providing insulating walls, a rectifying bridge can be formed. In FIG. 7A, the left-hand diode is identical to the left-hand diode of FIG. 6A and its elements are also designated with the same reference numerals. The essential difference between FIGS. 6A and 7A is the positioning of the metallizations. As previously, upper surface metallization M1 contacts finger 31 and lower surface metallization M2 contacts finger 37. However, this time, metallization M3 short-circuiting conductive fingers 32 and 35 is not locked in an insulating layer, but is accessible from the upper surface. Further, the entire structure is surrounded with a wall 39 made of an insulating material.

By forming two structures identical to that in FIG. 7A, and by connecting, for the two structures, metallizations M1 together, metallizations M2 together, and metallizations M3 to separate terminals, a rectifying bridge assembly such as that illustrated in FIG. 7B is obtained.

FIG. 8A and FIG. 8B show a combination of diodes forming a bi-directional avalanche diode. This diode is formed in an N-type semiconductor substrate 40. A conductive finger 41 starting from the upper surface is surrounded with a P-type region 42 and a conductive finger 43 starting from the lower surface is surrounded with a P-type region 44. An upper surface metallization M1 is in contact with finger 41 and a lower surface metallization M2 is in contact with finger 43.

Figure 9A:
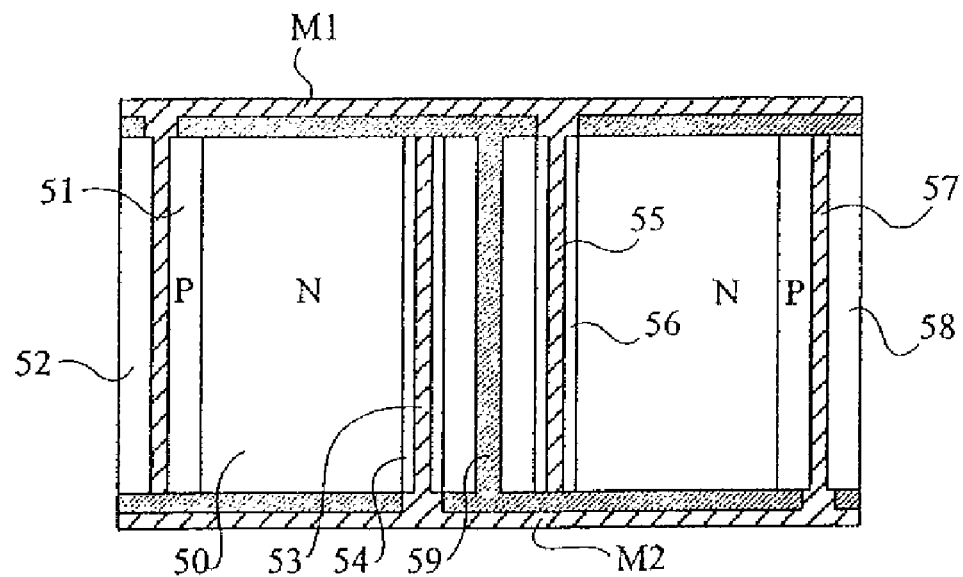
FIGS. 9A and 9B respectively are a simplified cross-section view and a circuit diagram of another diode assembly according to the present invention.
Figure 9B:
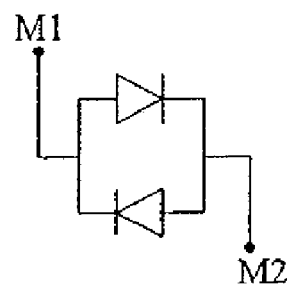

FIG. 9A is a cross-section view and FIG. 9B is a circuit diagram of an assembly of two diodes in antiparallel. The two diodes are formed in an N-type substrate 50. The left-hand diode comprises a conductive finger 51 surrounded with a P region 52, solid with an upper metallization M1. A conductive finger 53 surrounded with an N+ region 54 is solid with a lower metallization M2. Conversely, the right-hand diode comprises a conductive finger 55 surrounded with an N+-type region solid with upper metallization M1 and a conductive finger 57 surrounded with an N+ region 58 solid with lower metallization M2. The two diodes are separated by an insulating wall 59.

In the various drawings, the fingers are illustrated as through or not fingers. This depends on the embodiments and on the selected manufacturing technologies. In the case of through fingers, their end unconnected to a contact is isolated.

Figure 10A:
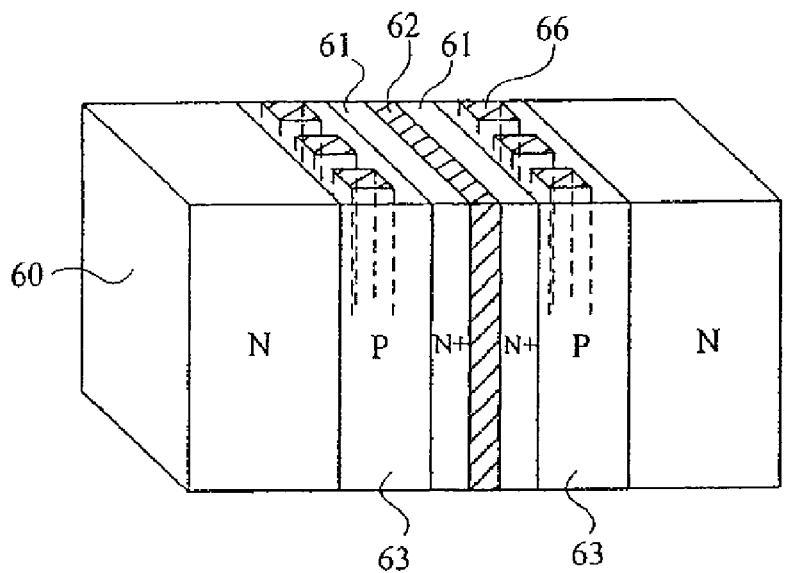
FIGS. 10A and 10B are a simplified perspective view and a cross-section view of a bipolar transistor according to the present invention.
Figure 10B:
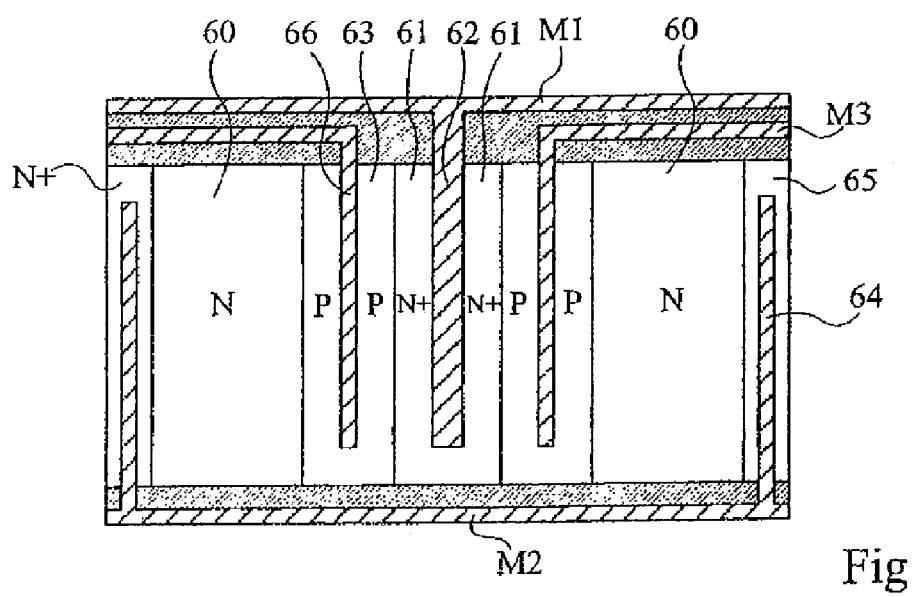

FIGS. 10A and 10B show a partial perspective view and a cross-section view of a realization according to the present invention of a bipolar transistor. The bipolar transistor is formed in an N-type substrate 60 and comprises a heavily-doped N-type emitter region 61 around a central conductive finger 62 extending across all or substantially all the substrate thickness. A P-type base region 63 is arranged around the emitter between the emitter and a collector region corresponding to substrate 60. As better shown in FIG. 10B, conductive fingers 64 starting from the lower surface are surrounded with N+ regions 65 and are used as a collector contact. An intermediary metallization M3 on the upper surface side is solid with conductive fingers 66 contacting base region 63. As illustrated in FIG. 10A, conductive fingers 66 are spaced apart as a grid to enable proper operation of the base. However, in a realization of the type of that of FIG. 4, fingers 64 may in fact form a conductive cylinder completely surrounding the shown transistor cell.

Figure 11A:
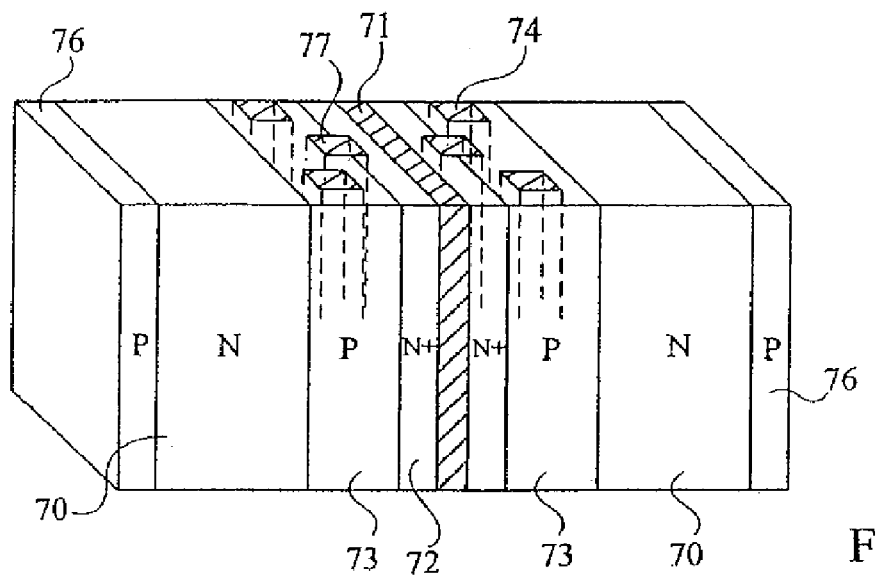
FIGS. 11A and 11B are a simplified perspective view and a cross-section view of a thyristor according to the present invention.
Figure 11B:
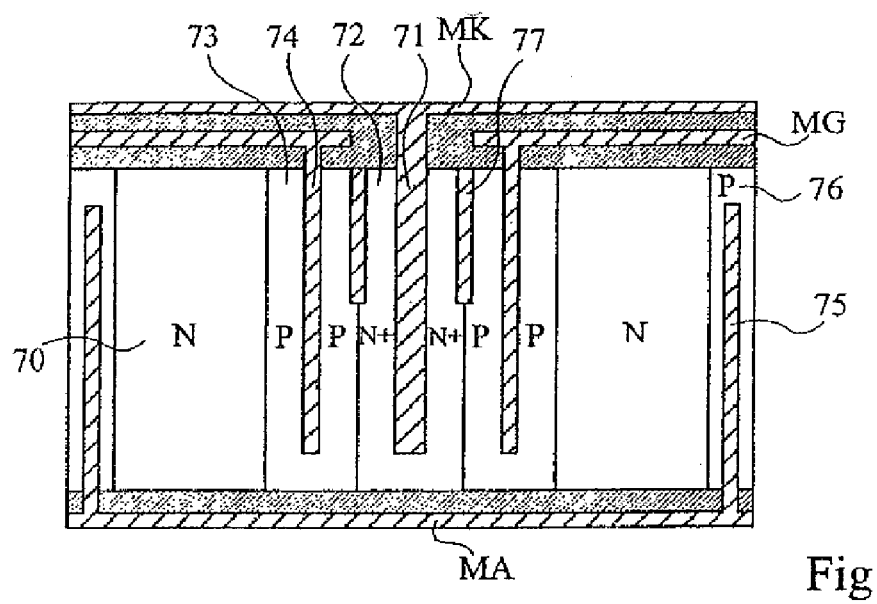

FIGS. 11A and 11B illustrate a thyristor structure respectively in perspective and in cross-section view. The structure is formed in an N-type semiconductor substrate 70, In a central region, a conductive finger 71 is surrounded with a heavily-doped N-type region 72 corresponding to the thyristor cathode and with a P layer 73. These regions may be formed by successively diffusing, from a through or substantially through opening, a P dopant, then an N dopant, or by simultaneously diffusing dopants having adequately different diffusion rates. Finger 71 is connected to a cathode metallization MK. Conductive fingers 74 penetrate into P-type region 73 and form gate contact points solid with a gate metallization MG. On the lower surface side, at the component periphery, are formed conductive fingers 75 surrounded with a P-type region 76 that forms the thyristor anode and which is connected by fingers 75 to an anode metallization MA. It should be noted that, as conventional in a thyristor, localized gate-cathode short-circuits may be formed by means of conductive fingers 77 only partially penetrating into the substrate between N region 72 and P region 74. Insulating regions, with no reference numerals, are intended to separate the various metallizations and to insulate the appropriate areas. The entire structure may be surrounded with an insulating wall.

A triac may be formed by assembling two thyristors of the above type in parallel and an in opposition.

The various illustrated structures are likely to have various alterations and modifications, and it should be noted by those skilled in the art that the alterations described for certain embodiments apply to other embodiments.

In the same way as an assembly of diode cells in parallel has been illustrated in FIGS. 3, 4, and 5A, thyristors or multicellular transistors may be formed by repeating a pattern. Each of the cells may be formed from parallel trenches, as in FIG. 3, or have a cylindrical geometry, as in FIG. 4. Cylinders with a non-circular cross-section, for example polygonal, may of course be chosen. Similarly, many component associations may be simply formed in the same substrate, separated or not by insulating walls.

On the other hand, many embodiments will readily occur to those skilled in the art, and will be possible according to the technical development, the forming of conductive fingers or of plates formed in trenches being examples only of possible approaches of the forming of the described structures with vertical junctions.

It should be noted that, since a greater density of components is obtained with vertical junction components according to the present invention than with conventional horizontal junction components, more heat will be generated per surface area unit when the components are on (although the on-state voltage drop is smaller due to the possible optimization of the thickness of the reverse voltage strength layer). However, this heat may advantageously be extracted by means of the through conductive fingers. Indeed, metal fingers have a heat conductivity from 2 to 3.5 times greater than the equivalent silicon volume. These fingers may take up a large surface area and, in particular, the peripheral "fingers" may take up the entire free surface area between elementary cells of a component.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor component in which the active junctions extend perpendicularly to a surface of a semiconductor chip substantially across the entire thickness thereof, wherein contacts with semiconductor regions to be connected are provided by metal fingers extending into the semiconductor regions, each of the metal fingers substantially crossing an entire semiconductor region within the semiconductor chip with which a contact is desired to be established.

2. The semiconductor component of claim 1, of multicellular type, wherein the junctions are formed of several cylinders perpendicular to the main substrate surfaces.

3. A diode according to claim 1, comprising an alternation of regions of a first conductivity type and of a second conductivity type extending across the entire substrate thickness, the regions of a first type being crossed by conductive fingers connected to a metallization extending over an entire surface of the substrate, and the regions of the second type being crossed by conductive fingers connected to a metallization on the other substrate surface.

4. The diode of claim 3, formed in an N-type semiconductor substrate, wherein the conductive fingers penetrating into the N-type regions are surrounded with heavily-doped N-type regions.

5. A bipolar transistor according to claim 1, alternately comprising a region of a first conductivity type, a region of a second conductivity type, and a region of the first conductivity type, each of these regions extending across the entire thickness of the substrate and being in contact with at least one conductive finger, each of these conductive fingers being respectively connected to an emitter metallization, to a base metallization, and to a collector metallization.

6. A thyristor according to claim 1, successively comprising a first region of a first conductivity type, a second region of the second conductivity type, a third region of the first conductivity type, and fourth region of the second conductivity type, each of these regions extending across the entire substrate thickness, a conductive finger extending into the entire first region, at least one conductive finger extending into the entire second region, and at least one conductive finger extending into the entire fourth region.

7. The thyristor of claim 6, wherein the first conductivity type is type N and the second conductivity type is type P, the first region being a cathode region and the fourth region an anode region, and wherein localized metallizations extend vertically between the gate region and the cathode region to form localized gate-cathode short-circuits.

8. A semiconductor component, comprising:
a substrate;
a first region of a first conductivity type that extends through the substrate;
a second region of a second conductivity type that extends through the substrate;
a p-n junction between the first region and the second region that extends through the substrate;
a first contact that extends through the substrate and contacts the first region, the first contact being positioned between semiconductor regions in the substrate; and
a second contact that extends through the substrate.

9. The semiconductor component of claim 8, wherein the p-n junction is at a junction of the first region and the second region.

10. The semiconductor component of claim 8, wherein the first contact and the second contact are metal contacts.

11. The semiconductor component of claim 8, wherein the first contact is arranged in a plane.

12. The semiconductor component of claim 11, wherein the plane is substantially parallel to a main surface of the substrate.

13. The semiconductor component of claim 8, wherein the first contact is arranged as a cylinder.

14. The semiconductor component of claim 8, wherein the first region of the first conductivity type comprises a high doping concentration near the first contact and a lower doping concentration away from the first contact.

15. The semiconductor component of claim 8, further comprising a first metallization that contacts the first contact, the first metallization being on a first main surface of the substrate.

16. The semiconductor component of claim 15, further comprising a second metallization that contacts the second contact, the second metallization being on a second main surface of the substrate.

17. The semiconductor component of claim 16, wherein the first main surface and the second main surface are on opposing sides of the substrate.

18. The semiconductor component of claim 8, wherein the first conductivity type is type N and the second conductivity type is type P.

19. The semiconductor component of claim 8, wherein the semiconductor component comprises a diode.

20. The semiconductor component of claim 19, wherein the semiconductor component comprises a plurality of diodes in the substrate.

21. The semiconductor component of claim 20, wherein at least two of the plurality of diodes are connected in parallel or series.

22. The semiconductor component of claim 20, wherein at least two of the plurality of diodes are connected in series opposition.

23. The semiconductor component of claim 20, wherein at least two of the plurality of diodes are connected in antiparallel.

24. The semiconductor component of claim 8, wherein the second contact contacts the second region.

25. The semiconductor component of claim 8, further comprising a conductive finger extending through the second region.

26. The semiconductor component of claim 25, wherein the conductive finger comprises a base of a bipolar transistor or a gate of a thyristor.

27. The semiconductor component of claim 8, further comprising:
   a third region of first conductivity type that contacts the second region and the second contact and extends through the substrate.

28. The semiconductor component of claim 27, wherein the semiconductor component comprises a bipolar transistor.

29. The semiconductor component of claim 8, further comprising:
   a fourth region of the second conductivity type that contacts the first region and the third region and extends through the substrate.

30. The semiconductor component of claim 29, wherein the semiconductor component comprises a thyristor.

31. The semiconductor component of claim 8, wherein the first contact extends into the first region.

32. A semiconductor component, comprising:
   a semiconductor substrate;
   a first region of a first conductivity type that extends through the semiconductor substrate;
   a second region of a second conductivity type that extends through the semiconductor substrate;
   an active junction that extends through an interior of the semiconductor substrate;
   a first contact that extends through the interior of the semiconductor substrate and contacts the first region; and
   a second contact that extends through the interior of the semiconductor substrate.

33. The semiconductor component of claim 32, wherein the active junction comprises a p-n junction.

34. The semiconductor component of claim 32, wherein the first region contacts the second region at the active junction.

35. The semiconductor component of claim 32, wherein the second contact contacts the second region.

36. The semiconductor component of claim 32, wherein the first region and the second region extend substantially through an entire thickness of the semiconductor substrate.

37. The semiconductor component of claim 32, wherein the first and second contacts extend substantially through an entire thickness of the semiconductor substrate.

38. The semiconductor component of claim 32, wherein the first contact extends into the first region.

* * * * *